United States Patent
Horibata et al.

(10) Patent No.: US 7,501,874 B2
(45) Date of Patent: Mar. 10, 2009

(54) LEVEL SHIFT CIRCUIT

(75) Inventors: Hiroyuki Horibata, Gifu (JP); Michiru Senda, Yokohama (JP)

(73) Assignee: Epson Imaging Devices Corporation, Nagano (JP)

(*) Notice: Subject to any disclaimer, the term of this patent is extended or adjusted under 35 U.S.C. 154(b) by 45 days.

(21) Appl. No.: 11/653,523

(22) Filed: Jan. 16, 2007

(65) Prior Publication Data

US 2007/0164805 A1 Jul. 19, 2007

(30) Foreign Application Priority Data

Jan. 16, 2006 (JP) ............... 2006-007581

(51) Int. Cl.
*H03L 5/00* (2006.01)
(52) U.S. Cl. .................. 327/333; 326/80; 326/81
(58) Field of Classification Search ................ 327/333
See application file for complete search history.

(56) References Cited

U.S. PATENT DOCUMENTS

| 2003/0042965 A1* | 3/2003 | Kanno et al. .............. 327/333 |
| 2004/0257142 A1* | 12/2004 | Kanno et al. .............. 327/333 |
| 2005/0206640 A1 | 9/2005 | Miyamoto et al. |
| 2005/0285659 A1* | 12/2005 | Kanno et al. .............. 327/333 |
| 2007/0001740 A1* | 1/2007 | Lin et al. ................... 327/333 |

FOREIGN PATENT DOCUMENTS

JP 2005-266043 9/2005

* cited by examiner

*Primary Examiner*—Long Nguyen
*Assistant Examiner*—Ryan C Jager
(74) *Attorney, Agent, or Firm*—McCarter & English, LLP

(57) ABSTRACT

A level shift circuit basically has a configuration connecting two CMOS inverter circuits in parallel, furnishes an input signal to a control terminal of the inverter circuit, obtains an output signal from an output terminal of the inverter circuit, and has a function for level shifting the voltage amplitude of the input signal to the voltage amplitude of the supply voltage of the inverter circuit. The signal that is input by the gate terminal of an n-channel transistor arranged in each of two current paths forming the level shift circuit is not a direct input signal but a signal that is supplied by adding an offset corresponding to the threshold of each n-channel transistor with respect to the voltage amplitude of the input signal via the input voltage converter circuit.

4 Claims, 5 Drawing Sheets

US 7,501,874 B2

LEVEL SHIFT CIRCUIT

CROSS-REFERENCES TO RELATED APPLICATIONS

This application claims priority to Japanese Patent Application No. 2006-007581, filed Jan. 16, 2006, which is incorporated herein by reference in its entirety.

BACKGROUND OF THE INVENTION

1. Field of the Invention

The present invention relates to a level shift circuit, and more particularly to a level shift circuit for shifting the level of the voltage amplitude of the input signal to a different voltage amplitude.

2. Description of the Related Art

A level shift circuit changes the voltage amplitude of a signal. For example, when an output voltage of a first circuit differs from an operating range of a second circuit, a level shift circuit is arranged between the first circuit and the second circuit and the level of the signal between circuits is adjusted. For example, in the driving system for an liquid crystal display panel, signals having various voltage amplitudes that are mutually different are employed. In this case, powers with these signals having different voltage amplitudes are generated from a common power supply and a level shift circuit is provided to adjust the levels of the signals between circuit blocks having different voltage amplitudes.

One circuit configuration for the level shift circuit for changing and outputting the voltage amplitude of an input signal source is a booster circuit employing capacitors and switching transistors. Another circuit configuration may employ inverter circuits to change the input signal amplitude to the voltage amplitude of the power supply. For example, JP-A-2005-266043 discloses a level shift circuit for an image display panel. A level shift circuit employing capacitor and switching devices is mentioned. Furthermore, a level shift circuit is mentioned where CMOS (Complementary Metal Oxide Semiconductor) inverters are connected in parallel. The CMOS inverter type of level shift circuit further connects a MOS transistor in series to each inverter so as to reduce the shoot-through current.

Using the CMOS inverter type of level shift circuit disclosed in the above-mentioned document enables the power consumption to be reduced with a simple configuration. This circuit configuration is suited for circuit systems such as those employed in LCDs (Liquid Crystal Display) for low power consumption. However, in the CMOS inverter type of level shift circuit, the response speed may depend on the threshold of the transistor. For example, in a CMOS inverter type of level shift circuit, suppose the supply voltage is 5.4 V, the gate of an n-channel transistor and the gate of a p-channel transistor forming the CMOS inverter are connected in common, and the common gate inputs a signal having voltage amplitude of 2.7 V. In this case, a signal having voltage amplitude of 5.4 V is obtained from a connection point connecting the n-channel transistor and the p-channel transistor. In this manner, the input signal having the voltage amplitude of 2.7 V has its signal level shifted to the output signal having the voltage amplitude of 5.4 V. In this level shift operation, the pulse rise time and the pulse fall time of the output signal is substantially dependent on the threshold of the n-channel transistor. If the threshold of the n-channel transistor is high, these transition times are substantially delayed. When the threshold is low, the shoot-through current during a transition increases and desirable low power consumption is prevented.

An advantage of the present invention is providing a level shift circuit capable of keeping the transition time within a predetermined range and improving the driving margin.

SUMMARY OF THE INVENTION

A level shift circuit relating to the invention has a first and second current paths arranged in parallel to a supply having a first voltage amplitude and respectively connected in series to a first transistor of a first polarity and a second transistor of a first polarity and a third transistor of a second polarity, a connection point connecting the second transistor and the third transistor in the first current path connected to a control terminal of the first transistor of the second current path and a connection point connecting the second transistor and the third transistor in the second current path connected to a control terminal of the first transistor of the first current path, an input signal having a second voltage amplitude smaller than the first voltage amplitude respectively input by a control terminal of the second transistor of the first current path and a control terminal of the second current path, the second voltage amplitude of the input signal level shifted to the first voltage amplitude and output from a connection point connecting the second transistor and the third transistor in the first current path or the second current path, an input voltage converter circuit wherein the input signal undergoes voltage conversion and a converted signal is respectively supplied to a control terminal of the third transistor of the first current path and the second current path, and the input voltage converter circuit adds an offset voltage corresponding to a threshold of the third transistor with respect to the second voltage amplitude.

Furthermore, it is preferable for the transistors to be of the voltage driven type.

Furthermore and preferably, in the level shift circuit relating to the invention, the input voltage converter circuit connects in series a fourth transistor of a first polarity and a fifth transistor of a second polarity, which are both voltage driven, between a terminal to which one of two voltages forming the second voltage amplitude is applied and a terminal to which the input signal is applied, the fourth transistor has a threshold identical to a threshold of the second transistor and a gate terminal and a drain terminal thereof are mutually connected, the fifth transistor has a threshold identical to the threshold of the third transistor and a gate terminal and a drain terminal thereof are mutually connected, the gate terminal of the fourth transistor and the fifth transistor are connected to the terminal to which the input signal is applied via a common capacitor, a connection point connecting the fourth transistor and the fifth transistor is connected to the control terminal of the third transistor of the first current path or the second current path, and an output rise characteristic from a threshold of the fifth transistor is steeper than an output rise characteristic from a threshold of the fourth transistor.

Furthermore, it is preferable for the W/L of the fifth transistor to be at least two times the W/L of the fourth transistor.

Furthermore, it is preferable for the signal that is input by the control terminal of the second transistor of the second current path to be created by inverting the signal that is input by the control terminal of the second transistor of the first current path.

In the level shift circuit having the above-mentioned configuration, the first transistor of the first polarity is further connected in series to a complementary inverter connecting in series the second transistor of the first polarity and the third transistor of the second polarity. Then, a connection point connecting the second transistor and the third transistor in the first current path is connected to the control terminal of the first transistor of the second current path. Conversely, a connection point connecting the second transistor and the third transistor in the second current path is connected to the control terminal of the first transistor of the first current path. Therefore, in the so-called complementary inverter type of level shift circuit, the shoot-through current during a transition can be reduced due to the action of the first transistors.

Then, the input signal having a second voltage amplitude, which is smaller than a first voltage amplitude or the supply voltage amplitude of the level shift circuit, is directly input by the control terminal of the second transistor and is input via an input voltage converter circuit by the control terminal of the third transistor. The input voltage converter circuit adds an offset voltage corresponding to the threshold of the third transistor with respect to the second voltage amplitude. Therefore, compared to the signal that is input by the control terminal of the second transistor, the signal with an offset corresponding to the threshold of the third transistor is input by the control terminal of the third transistor.

For example, when the supply voltage of the level shift circuit is set at 5.4 V, this corresponds to the first supply voltage amplitude, and when the voltage amplitude of the input signal is set to 2.7 V, this corresponds to the second voltage amplitude. Then, the second voltage amplitude of 2.7 V is input by the control terminal of the second transistor of the first polarity while the offset voltage corresponding to the threshold of the third transistor with respect to the 2.7 V of the second voltage amplitude is input by the control terminal of the third transistor of the second polarity. Namely, with the threshold of the third transistor as Vthn, a signal having a lower limit of 0 V+Vthn and an upper limit of 2.7 V+Vthn is input by the control terminal of the third transistor of the second polarity. Thus, while maintaining the voltage amplitude with respect to the voltage amplitude of 0 V to 2.7 V, a signal with the voltage level offset by the magnitude of the threshold Vthn is input by the control terminal of the third transistor of the second polarity.

As described hereinabove, in the complementary inverter type of level shift circuit, the transistor threshold determines the transition time. In the level shift circuit with the above-mentioned configuration, while maintaining the voltage amplitude as the input signal, the voltage level is offset corresponding to the threshold of the third transistor and input by the control terminal of the third transistor. Therefore, in the level shift circuit, the transition time can be kept within a predetermined range regardless of the threshold of the third transistor and the driving margin can be improved while reducing the power consumption.

Furthermore, the transistors are of the voltage driven type so that lower power consumption can be achieved in comparison to the case of the current driven type.

Furthermore, as a configuration of the input voltage converter circuit, a device in which the gate terminal and the drain terminal of the voltage driven fourth transistor of the first polarity are mutually connected and a device in which the gate terminal and the drain terminal of the voltage driven fifth transistor of the second polarity are connected in series. Then, these two devices connected in series are arranged between a terminal to which is applied one of two voltages forming the second voltage amplitude and a terminal to which is applied the input signal.

The voltage-current characteristic of the device in which the gate terminal and the drain terminal of the voltage driven transistor are mutually connected is known to rise at the threshold of the transistor. With a device connected in this manner using the fourth transistor of the first polarity and a device connected in this manner using the fifth transistor of the second polarity are connected in series, when current flows to each device, the voltage of the connection point becomes a value determined by the intersection of the rise characteristics of the devices. In the above-mentioned configuration, the output rise characteristic from the threshold of the fifth transistor was set steeper than the output rise characteristic from the threshold of the fourth transistor. Therefore, in the configuration in which the devices are connected in series, when current flows to the devices, the voltage at the connection point connecting the devices is near the threshold of the fifth transistor. Current flows to the devices when the input signal is an L level with respect to one of two voltages forming the second voltage amplitude. Therefore, when the input level is an L level, the voltage at the connection point connecting the devices includes an added offset corresponding to the threshold of the fifth transistor with respect to the voltage of the L level of the input signal.

The connection point mutually connecting the devices is connected with the gate terminal of the third transistor as the output terminal of the input voltage converter circuit. And, the threshold of the fifth transistor is identical to the threshold of the third transistor. As a result, from this configuration, when the input level is at the L level, the gate terminal of the third transistor inputs a voltage that has been added with an offset corresponding to the threshold of the third transistor with respect to the voltage of the L level.

Furthermore, as a configuration of the input voltage converter circuit, the gate terminals of the fourth transistor and the fifth transistor are connected to the terminal to which is applied the input signal via the common capacitor. Thus, when current does not flow to the devices, the connection point connecting the devices is charged via the capacitor. Here, the current does not flow to the devices when the input signal is at an H level with respect to one of two voltages forming the second voltage amplitude. Therefore, while current does not flow to the devices, the voltage at the connection point connecting the devices includes the voltage of the H level added to the voltage of the connection point when the input is at the L level, namely, the voltage that has been offset corresponding to the threshold of the third transistor with respect to the L level.

In summary, when the input signal is at the L level, the input voltage converter circuit having the above-mentioned configuration outputs a voltage in which an offset corresponding to the threshold of the third transistor has been added to the L level. Then, when the input signal is at the H level, a voltage is output in which the voltage of the H level has been added to the voltage that is output when the input signal is at the L level. In this manner, the input voltage converter circuit having the above-mentioned configuration maintains the voltage amplitude with respect to the voltage amplitude of the L level to H level of the input signal and can output a signal having a voltage to which an offset is added corresponding to the threshold of the third transistor with respect to the voltage of the input signal.

Furthermore, since the W/L of the fifth transistor is at least two times the W/L of the fourth transistor, the output rise characteristic of the fifth transistor can be set steeper than the output rise characteristic of the fourth transistor using a simple configuration.

Furthermore, since the signal that is input by the control terminal of the second transistor of the second current path is created by inverting the signal that is input by the control terminal of the second transistor of the first current path, the level shift circuit can be driven with a simpler configuration.

In this manner, according to the level shift circuit relating to the invention, the transition time can be kept within a predetermined range and the driving margin can be improved while reducing the power consumption.

DETAILED DESCRIPTION OF THE INVENTION

Embodiments relating to the invention will be described hereinafter with reference to the drawings. Furthermore, the voltages, thresholds, transistor dimensions, capacitance values, and so forth described hereinafter are examples merely for the purpose of illustration and can be appropriately modified according to the applicable values.

Figure 1:
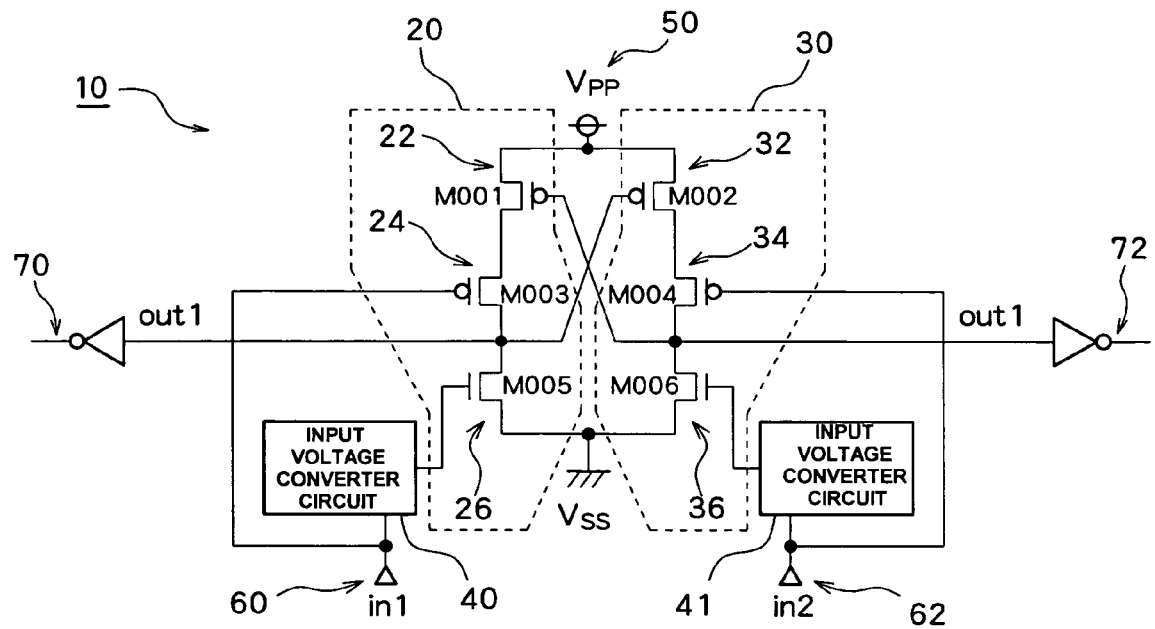
FIG. 1 shows a configuration of a level shift circuit in an embodiment relating to the invention.

FIG. 1 is a circuit diagram showing a level shift circuit 10 used in an LCD panel drive circuit. The level shift circuit 10 basically has a configuration where two CMOS-type inverter circuits are connected in parallel. Then, to control terminals of the inverter circuits are applied input signals 60, 62 and from output terminals of the inverter circuits are obtained output signals 70, 72. Thus, the voltage amplitude of the input signal is converted to a voltage amplitude of the supply voltage Vpp for the inverter circuit. In addition to the basic configuration, the level shift circuit 10 of FIG. 1 is also designed to reduce the shoot-through current and to improve the driving margin through operation within a predetermined transition time.

The level shift circuit 10 has a first current path 20 and a second current path 30 arranged in parallel between a supply voltage Vpp 50 and a ground Vss. The first current path 20 and the second current path 30 have identical components. Namely, each path has a CMOS converter circuit where a p-channel transistor is connected in series.

The first current path 20 has a p-channel transistor 22, a p-channel transistor 24, and an n-channel transistor 26 connected in series with the source terminal of the p-channel transistor 22 connected to the supply voltage Vpp and the source terminal of the n-channel transistor 26 connected to the ground Vss. If the p-channel transistor 22 is designated as a first transistor, the p-channel transistor 24 as a second transistor, and the n-channel transistor 26 as a third transistor in the sequence of the series connection, the first transistor 22 and the second transistor 24 have the same polarity and the third transistor 26 has a different polarity from the other two transistors. As described above, the second current path 30 has the same configuration as the first current path 20. Namely, the second current path 30 has a p-channel transistor 32, a p-channel transistor 34, and an n-channel transistor 36 connected in series with the source terminal of the p-channel transistor 32 connected to the supply voltage Vpp and the source terminal of the n-channel transistor 36 connected to the ground Vss.

The p-channel transistor 24 and the n-channel transistor 26 do not have a common gate terminal but form a type of CMOS inverter circuit. Furthermore, similarly, the p-channel transistor 34 and the n-channel transistor 36 also form a type of CMOS inverter circuit. The p-channel transistors 22, 32 are devices having a function for reducing the shoot-through current during the transition time in the operation of the CMOS inverter circuits. Thus, the gate terminal of the p-channel transistor 22 in the first current path 20 is input by the output of the CMOS inverter circuit of the second current path 30. Similarly, the gate terminal of the p-channel transistor 32 in the second current path 30 is input by the output of the CMOS inverter circuit of the first current path 20. In the actual circuit operation, a time delay occurs between a transition change in the output of either CMOS inverter circuit and the on-off timing of the p-channel transistor that is connected in series to the other current path. Due to this time delay, the abovementioned configuration can reduce the shoot-through current during the transition period of the operation of the CMOS inverter circuit.

In an ordinary CMOS inverter circuit, the gate terminal of the p-channel transistor and the gate terminal of the n-channel transistor are shared as a single input terminal. However, the level shift circuit of FIG. 1 has a different configuration. Namely, when describing the first current path 20, the p-channel transistor 24 directly inputs an input signal in1 and the n-channel transistor 26 inputs a signal via an input voltage converter circuit 40. Similarly, for the second current path 30, the p-channel transistor 34 directly inputs an input signal in2 and the n-channel transistor 36 inputs a signal via an input voltage converter circuit 41. The two input signals in1 and in2 have mutually opposite polarities and the same voltage amplitudes. The voltage amplitudes of the input signals 60, 62 differ from the voltage amplitude of the supply voltage Vpp of the level shift circuit. For example, at Vpp=5.4 V, the voltage amplitudes of the input signals 60, 62 can be set at 2.7 V.

The input voltage converter circuits 40, 41 convert the voltage amplitude as the input signal into a signal applied with an offset voltage corresponding to a threshold of the n-channel transistors 26, 36 or third transistors. The converted signals are supplied to the gate terminals of the n-channel transistors 26, 36. Since the two input voltage converter circuits 40, 41 have the same configuration, the configuration of the input voltage converter circuit 40 will be described hereinafter.

Figure 2:
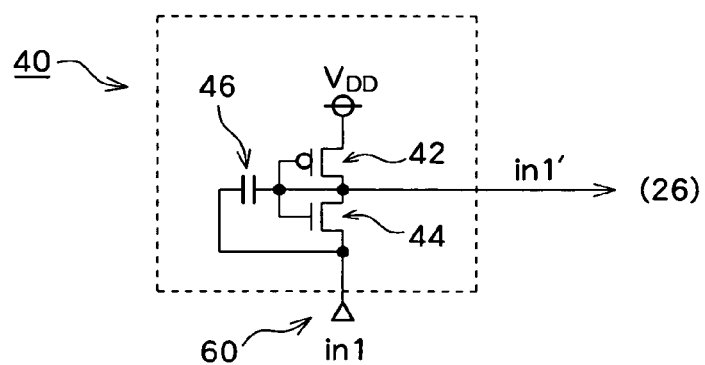
FIG. 2 shows a configuration of an input voltage conversion circuit included in the shift level circuit in the embodiment relating to the invention.

FIG. 2 shows the configuration of the input voltage converter circuit 40. The input voltage converter circuit 40 has a configuration where a so-called MOS resistor is connected in series to which a capacitor is added. With the voltage amplitude of the input signal 60 at $V_{DD}$, the H level for the input signal 60 is $V_{DD}$ and the L level is ground $V_{SS}$=0 V. The input voltage converter circuit 40 has two terminals, one of which is connected to a supply having a voltage amplitude of $V_{DD}$ with respect to ground and to the other is supplied the input signal 60. In the above-mentioned example, one of the two terminals is connected to a 2.7 V power supply and to the other is connected the input signal 60 with a 2.7 V voltage amplitude.

The two MOS resistors forming the input voltage converter circuit 40 is formed in the following manner. Namely, the gate terminal and the drain terminal of a p-channel transistor 42 having the same threshold as the second transistor 24 of FIG. 1 are mutually connected to form one p-channel MOS resistor. Similarly, the gate terminal and the drain terminal of an n-channel transistor 44 having the same threshold as the third transistor 26 are mutually connected to form one n-channel MOS resistor. Here, forming the input voltage converter circuit 40 are the p-channel transistor as the fourth transistor and the n-channel transistor as the fifth transistor. As is well known, the MOS resistors formed in this manner have an output rise characteristic where current begins to flow at the threshold and the current ideally increases with the increase in voltage across the terminals according to the so-called square-law characteristic of MOS transistors.

With the transistor gate length as L and the gate region width as W, W/L of the n-channel transistor 44 is set larger than the W/L of the p-channel transistor 42. For example, the W/L of the n-channel transistor 44 is set at least two times the W/L of the p-channel transistor 42. Or, the W/L of the p-channel transistor 42 is set at ½ or less than the W/L of the n-channel transistor 44. Therefore, compared to the p-channel MOS resistor, the n-channel MOS resistor has a voltage-current characteristic that steeply rises from the threshold.

Since the MOS resistors having mutually differing polarities are connected in series, the gate terminal and the drain terminal of the p-channel transistor 42 and the gate terminal and the drain terminal of the n-channel transistor 44 are mutually connected and this mutual connection point is the output terminal of the input voltage converter circuit 40 as shown in FIG. 2. An output signal in1', after voltage conversion from the original input signal in1, is output from this output terminal and supplied to the gate terminal of the third transistor 26 of FIG. 1.

A capacitor 46 forming the input voltage converter circuit 40 is the output terminal of this input voltage converter circuit 40 and is arranged between the common gate connection point connecting the gate terminals of the two MOS resistors and the input terminal 60 of the input voltage converter circuit 40. Namely, the capacitor 46 has a function for alternately voltage supplying the input signal 60 with respect to the output terminal of the input voltage converter circuit 40.

Figure 3A:
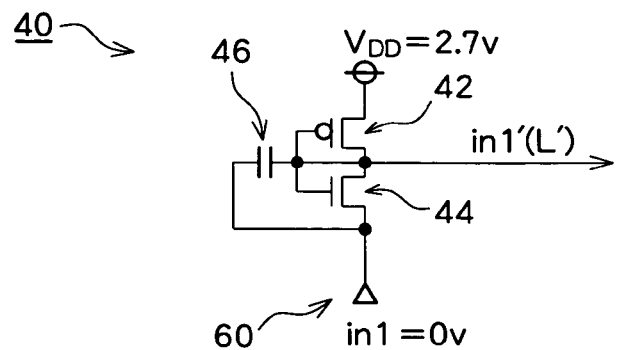
FIG. 3(a) illustrates the voltages of each terminal of the input voltage conversion circuit when the input signal is 0 V in the embodiment relating to the invention.
Figure 3B:
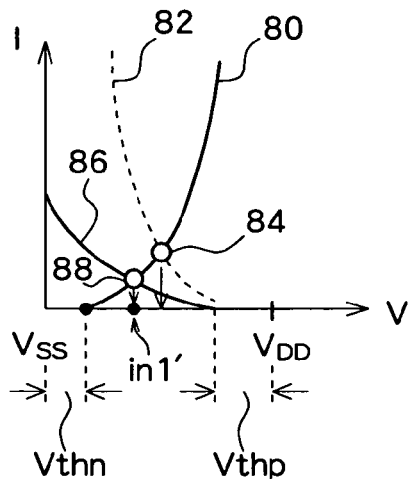
FIG. 3(b) illustrates an operation of the input voltage conversion circuit in the embodiment relating to the invention.
Figure 3C:
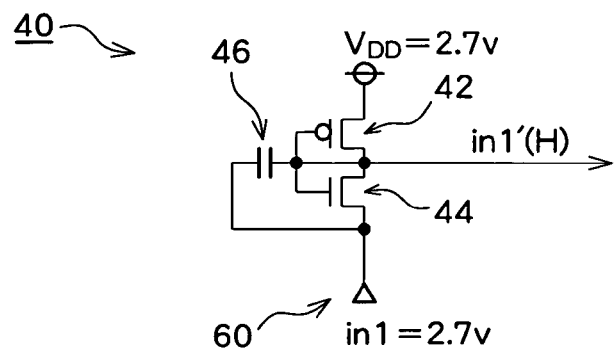
FIG. 3(c) illustrates the voltages of each terminal of the input voltage conversion circuit when the input signal is 2.7 V in the embodiment relating to the invention.
Figure 4:
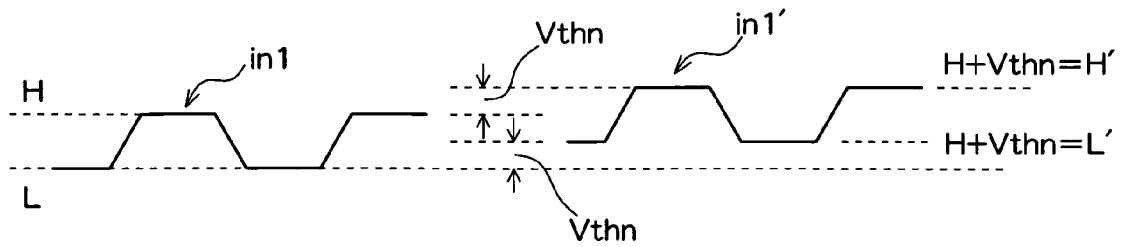
FIG. 4 compares an input signal in1 and an output signal in1' of the input voltage conversion circuit in the embodiment relating to the invention.

The action of the input voltage converter circuit 40 of the related configuration is described with reference to FIG. 3 and FIG. 4. As described hereinabove, the action here will be described with the H level of the input signal 60 as 2.7 V and the L level as 0 V. FIG. 3(a) shows the voltage of each terminal of the input voltage converter circuit 40 when the input signal in1 is 0 V. FIG. 3(b) shows the voltage-current characteristics of the two MOS resistors when the input signal in1 is 0 V and illustrates the state when the intersection of the two characteristics becomes the output signal of the input voltage converter circuit 40. FIG. 3(c) shows the voltage of each terminal of the input voltage converter circuit 40 when the input signal in1 is 2.7 V. FIG. 4 compares the input signal in1 and the output signal in1' of the input voltage converter circuit 40.

When the input signal in1 is 0 V, 2.7 V is applied across the two MOS resistors as shown in FIG. 3(a). The voltage-current characteristic of each MOS resistor is shown in FIG. 3(b). The voltage V applied across the input voltage converter circuit 40 is shown on the abscissa and the current flowing through each MOS resistor is shown on the ordinate. A voltage-current characteristic 80 of the MOS resistor where the gate terminal and the drain terminal of the n-channel transistor 44 are mutually connected shows a rise from a threshold Vthn of the n-channel transistor 44. On the other hand, a voltage-current characteristic 86 of the MOS resistor where the gate terminal and the drain terminal of the p-channel transistor 42 shows a rise from a threshold Vthp of the p-channel transistor 42. These rising characteristics show increasing current with decreasing voltage from a voltage that is the absolute value of Vthp less than $V_{DD}$ due to the difference in polarity.

The steepness of the rise in the voltage-current characteristic of the MOS resistor changes depending on the W/L of the transistor. The rise becomes steeper with larger W/L and gentler with smaller W/L. Furthermore, if the W/L is the same, the rise for the n-channel MOS resistor is generally steeper than for the p-channel MOS resistor due to the difference in the mobility of electrons and holes. By setting the W/L of the n-channel transistor 44 to be at least two times the W/L of the p-channel transistor 42 as described above and due to the difference in mobility, the rise characteristic of the n-channel MOS resistor is steeper than the rise characteristic of the p-channel MOS resistor.

The output signal in1' of the input voltage converter circuit 40 is at the voltage of the connection point of the two MOS resistors connected in series so that an intersection 88 of the voltage-current characteristics of the two MOS resistors is a point where the current is the same. Therefore, when the rise characteristic of the n-channel MOS resistor is steeper than the rise characteristic of the p-channel MOS resistor, the intersection 88 approaches the starting point of the voltage-current characteristic of the n-channel MOS resistor, namely, Vthn.

FIG. 3(b) shows for reference a voltage-current characteristic 82 for the p-channel MOS resistor having a rise characteristic substantially identical to that of the n-channel MOS resistor. The voltage value at an intersection 84 in this case is nearly $V_{DD}/2$ with the absolute values of Vthn and Vthp identical. In comparison, when the rise characteristic of the p-channel MOS resistor is gentler than the rise characteristic of the n-channel MOS resistor, the voltage value at the intersection of the two characteristics as described hereinabove is lower than $V_{DD}/2$ and close to Vthn.

From the above, when the input signal 60 is at the L level of 0 V in the input voltage converter circuit 40, it can be appreciated that the output of the input voltage converter circuit 40 approaches the threshold Vthn of the third transistor 26. By setting the output rise characteristic of the n-channel transistor 26 to be sufficiently steeper than the rise characteristic of the p-channel transistor 24, when the input signal 60 is 0 V, the output signal in1' of the input voltage converter circuit 40 can be set to a value of voltage signal substantially identical to Vthn. Therefore, the output signal in1' of the input voltage converter circuit 40 will be described hereinafter as a signal having a voltage identical to Vthn when the input signal 60 is 0 V.

When the input signal 60 is at an H level, namely, 2.7 V, the state is shown in FIG. 3(c) and current does not flow to the MOS resistors. Then, the capacitor 46 is charged by the input signal 60 and the voltage at the common connection point to where the MOS resistors are connected rises from the voltage at Vthn when the input signal is 0 V to the voltage of 2.7 V at the input signal 60. Here, the common connection point to where the MOS resistors are connected is also the output terminal of the input voltage converter circuit 40. Thus, when the input signal 60 is 2.7 V, the output signal of the input voltage converter circuit 40 becomes 2.7 V+Vthn.

In this manner, it can be appreciated that when the input signal 60 is 0 V, the input voltage converter circuit 40 outputs the threshold Vthn of the n-channel transistor 26, which is the third transistor, and when the input voltage is 2.7 V, 2.7 V+Vthn is output. In more general terms, from the above, when the input signal 60 is at an L level, the L level voltage+ Vthn is output, and when the input voltage is at an H level, the H level voltage +Vthn is output. Thus, the input voltage converter circuit 40 performs conversion by outputting a signal where an offset voltage corresponding to the threshold Vthn of the third transistor is added to the voltage level of the voltage amplitude of the input signal. Then, this is supplied to the third transistor as the output signal in1' after conversion.

FIG. 4 shows the relationship between the voltage amplitude of the input signal in1 and the voltage amplitude of the output signal in1' after the input signal in1 is converted by the input voltage converter circuit 40. In this manner, the output signal in1' of the input voltage converter circuit 40 becomes a signal where an offset is added corresponding to the threshold Vthn of the n-channel transistor 26, which is the third transistor, to the voltage shift level with the same voltage amplitude as the original voltage amplitude with respect to the input signal in1.

In this manner, the level shift circuit 10 basically has two CMOS inverter circuits connected in parallel and a p-channel transistor is further connected in series to each CMOS inverter circuit. Furthermore, in each CMOS inverter circuit, the input signal in1 is directly input by the p-channel transistor 24 and a signal where an offset is added corresponding to the threshold Vthn of the n-channel transistor 26 with respect to the input signal in1 is input via the input voltage converter circuit 40 by the n-channel transistor 26.

Figure 5:
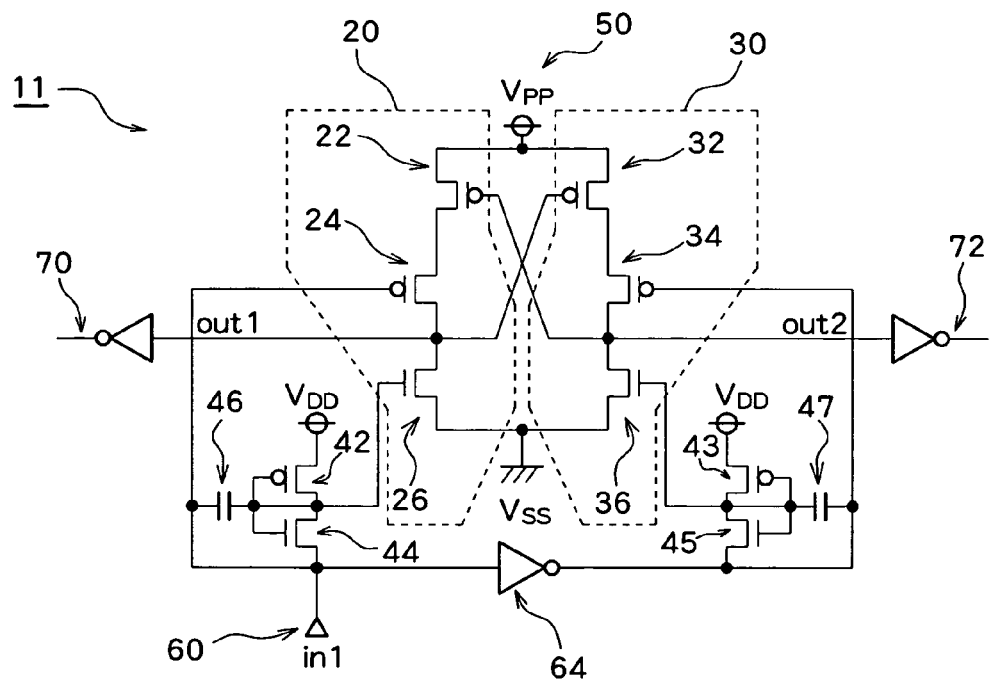
FIG. 5 shows a configuration of a level shift circuit in another embodiment.

Two independent input signals 60, 62 were described hereinabove as being respectively supplied to the first current path 20 and the second current path 30. It should be noted that instead of this, the single input signal 60 may be supplied to the first current path 20 and may also be supplied via an inverter circuit 64 to the second current path 30 as shown by a level shift circuit 11 in FIG. 5.

Figure 6:
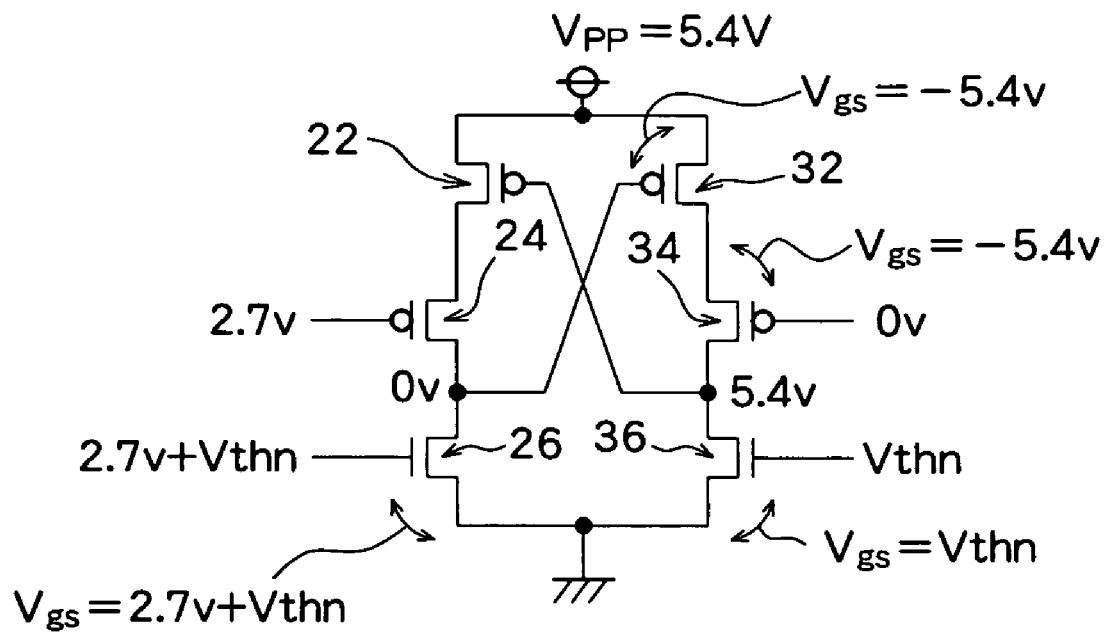
FIG. 6 illustrates why the operating range of the level shift circuit of the embodiment relating to the invention hardly depends on the threshold of the n-channel transistors.

FIG. 6 illustrates a reason why the operating range of the level shift circuit 10 hardly depends on the threshold of the n-channel transistors 26, 36. FIG. 6 shows a state where the gate terminal of the n-channel transistor 26 inputs a voltage of 2.7 V+Vthn as an H level and the gate terminal of the n-channel transistor 36 inputs a voltage of Vthn as an L level. At this time, the voltage Vgs between the gate and source of the n-channel transistor 26 of the first current path becomes 2.7 V+Vthn and the n-channel transistor 26 can be sufficiently turned on regardless of the threshold Vthn. Furthermore, the voltage Vgs between the gate and source of the p-channel transistor 32 of the second current path is −5.4 V so that the p-channel transistor 32 can be sufficiently turned on without much influence from the threshold. Therefore, in either CMOS inverter circuit forming the level shift circuit 10, the transistor that is to be turned on can be sufficiently turned on without much influence from the threshold so that the operating range of the level shift circuit 10 is broad resulting in a wide driving margin.

Figure 7:
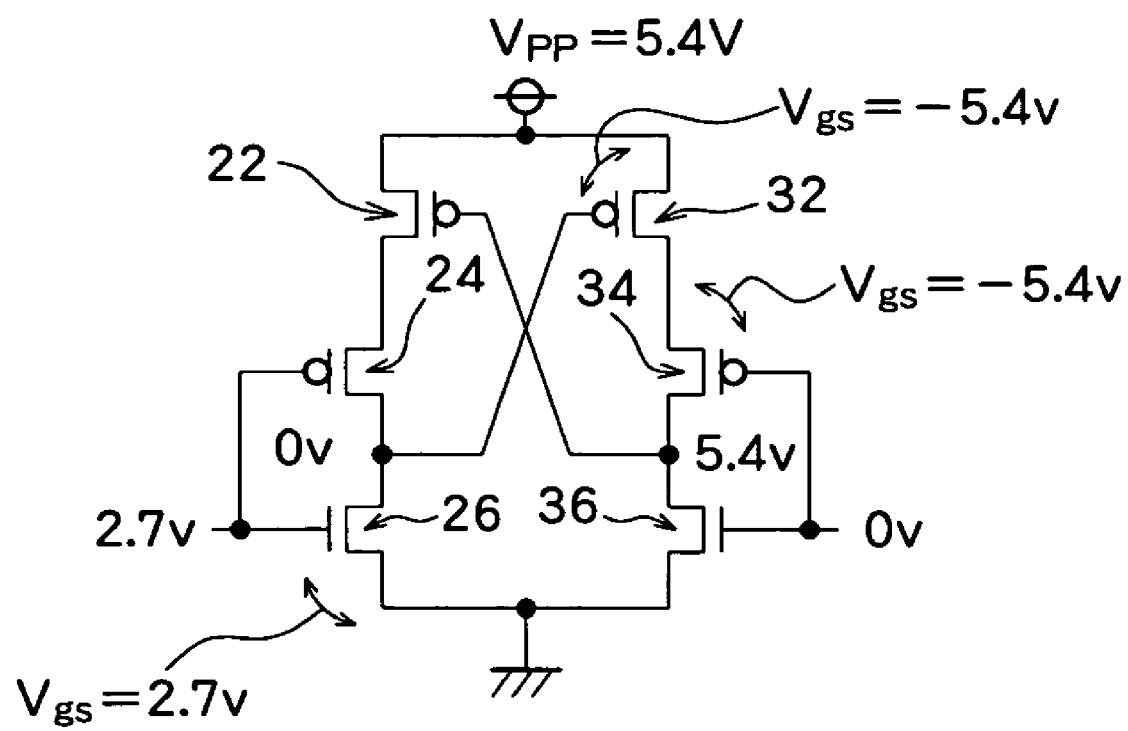
FIG. 7 illustrates why the operating range of the level shift circuit shown as a comparative example substantially depends on the threshold of the n-channel transistors.

FIG. 7 illustrates why the operating range of the level shift circuit not employing the function of the input voltage converter circuit substantially depends on the threshold of the n-channel transistors 26, 36. FIG. 7 shows a state where the gate terminal of the n-channel transistor 26 inputs a voltage of 2.7 V as an H level and the gate terminal of the n-channel transistor 36 inputs a voltage of 0 V as an L level. At this time, the voltage Vgs between the gate and source of the n-channel transistor 26 of the first current path becomes 2.7 V and the n-channel transistor 26 turns on while dependent on the threshold Vthn. Furthermore, the voltage Vgs between the gate and source of the p-channel transistor 32 of the second current path is −5.4 V so that the p-channel transistor 32 can be sufficiently turned on without much influence from the threshold. Therefore, in the CMOS inverter circuits forming a level shift circuit 8, the n-channel transistor that is to be turned on turns on while dependent on the threshold so that the operating range of the level shift circuit 8 is narrow and highly dependent on the threshold of the n-channel transistor to be turned on.

In this manner, in the CMOS inverter circuits forming the level shift circuit, the input signal is not directly supplied to the gate terminal of the n-channel transistor but supplied after the addition of an offset corresponding to the threshold of the n-channel transistor with respect to the voltage amplitude of the input signal. This can widen the driving margin of the level shift circuit at a reduced current consumption.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A level shift circuit comprising:
   a first current path and a second current path disposed in parallel to a supply having a first voltage amplitude and respectively connected in series to a first transistor of a first polarity and a second transistor of the first polarity and a third transistor of a second polarity;
   a connection point connecting the second transistor and the third transistor in the first current path connected to a control terminal of the first transistor of the second current path and a connection point connecting the second transistor and the third transistor in the second current path connected to a control terminal of the first transistor of the first current path;
   an input signal having a second voltage amplitude smaller than the first voltage amplitude respectively input by a control terminal of the second transistor of the first current path and a control terminal of the second transistor of the second current path;
   the second voltage amplitude of the input signal level shifted to the first voltage amplitude and output from the connection point connecting the second transistor and the third transistor in the first current path or the second current path; and
   an input voltage converter circuit wherein the input signal undergoes voltage conversion and a converted signal is respectively supplied to a control terminal of the third transistor of the first current path and the second current path;
   the input voltage converter circuit adds an offset voltage corresponding to a threshold of the third transistor with respect to the second voltage amplitude;
   wherein the input voltage converter circuit connects in series a fourth transistor of the first polarity and a fifth transistor of the second polarity, which are both voltage driven, between a terminal to which one of two voltages forming the second voltage amplitude is applied and a terminal to which the input signal is applied;
   the fourth transistor has a threshold identical to a threshold of the second transistor and a gate terminal and a drain terminal thereof are mutually connected;
   the fifth transistor has a threshold identical to the threshold of the third transistor and a gate terminal and a drain terminal thereof are mutually connected;
   the gate terminal of the fourth transistor and the fifth transistor are connected to the terminal to which the input signal is applied via a common capacitor;

a connection point connecting the fourth transistor and the fifth transistor is connected to the control terminal of the third transistor of the first current path or the second current path; and an output rise characteristic from a threshold of the fifth transistor is steeper than an output rise characteristic from a threshold of the fourth transistor.

2. A level shift circuit according to claim 1 wherein the each transistor is a voltage driven type.

3. A level shift circuit according to claim 1 wherein W/L of the fifth transistor is at least two times the W/L of the fourth transistor.

4. A level shift circuit according to claim 1 wherein the signal that is input by the control terminal of the second transistor of the second current path is created by inverting the signal that is input by the control terminal of the second transistor of the first current path.

* * * * *